United States Patent [19]

Katz et al.

[11] Patent Number: 5,197,654
[45] Date of Patent: Mar. 30, 1993

[54] BONDING METHOD USING SOLDER COMPOSED OF MULTIPLE ALTERNATING GOLD AND TIN LAYERS

[76] Inventors: Avishay Katz, 720 Saint Marks Ave., Westfield, N.J. 07090; Chien-Hsun Lee, 375 N. Drive, B7, North Plainfield, N.J. 07060; King L. Tai, 95 Highland Cir., Berkeley Heights, N.J. 07922; Yiu-Man Wong, 5001 Maranatha Way, Wescosville, Pa. 18106

[21] Appl. No.: 792,559

[22] Filed: Nov. 15, 1991

[51] Int. Cl.⁵ .......................... H01L 21/58
[52] U.S. Cl. .................... 228/124; 228/123; 428/647
[58] Field of Search ............ 228/122, 124, 121, 123; 428/647

[56] References Cited

U.S. PATENT DOCUMENTS

| | | | |
|---|---|---|---|
| 3,006,069 | 10/1961 | Rhoads et al. | 228/124 M |
| 3,141,226 | 7/1964 | Bender | 428/647 |
| 3,181,935 | 5/1965 | Coad | 428/647 |
| 4,360,965 | 11/1982 | Fujiwara | 29/582 |
| 4,772,935 | 9/1988 | Lawler et al. | 228/123 |
| 4,875,617 | 10/1989 | Citowsky | 228/123 |
| 5,027,997 | 7/1991 | Bendik et al. | 228/123 |

FOREIGN PATENT DOCUMENTS 8700967 11/1988 Netherlands .................. 428/647

OTHER PUBLICATIONS

Wada, O. et al., "Preferential reaction and stability of the Au-Sn/Pt system: Metallization structure for flip--chip integration," *Appl. Phys. Lett.* 58 (9), Mar. 4, 1991, pp. 908-910.

Primary Examiner—Kenneth J. Ramsey
Attorney, Agent, or Firm—D. I. Caplan

[57] ABSTRACT

A device such as a laser is bonded to a submount such as diamond by a process in which the submount is successively coated with an adhesion layer such as titanium, a barrier layer such as nickel, and a gold-tin solder-metallization composite layer formed by sequential deposition on the barrier layer a number (preferably greater than seven) of multiple alternating layers of gold and tin, the last layer being gold having a thickness that is equal to approximately one-half or less than the thickness of the (next-to-last) tin layer that it contacts immediately beneath it. The bonding is performed under applied heat that is sufficient to melt the solder-metallization composite layer. Prior to the bonding, (in addition to the submount) the device advantageously is coated with gold and optionally with a similar gold-tin solder-metallization composite layer, at least at locations where it comes in contact with the gold-tin solder-metallization composite layer.

14 Claims, 1 Drawing Sheet

BONDING METHOD USING SOLDER COMPOSED OF MULTIPLE ALTERNATING GOLD AND TIN LAYERS

TECHNICAL FIELD

This invention relates to bonding methods, and more particularly to methods for bonding devices that generate heat during subsequent operation such as semiconductor laser devices.

BACKGROUND OF THE INVENTION

During operation of a semiconductor laser device, i.e., when it is generating optical radiation, it also generates relatively large amounts of heat that must be quickly and efficiently conducted away from the device, lest its temperature rise to an undesirable level and its useful device lifetime be undesirably reduced.

U.S. Pat. No. 4,772,935 teaches a process for thermal-compression bonding of a silicon integrated circuit due to a package comprising a header. The process utilizes sequential formation on a major surface of a silicon wafer (substrate), prior to its being cut into a plurality of dies, the following successive layers: (1) an adhesion layer of titanium; (2) a barrier layer, preferably of tungsten; (3) a bonding layer, preferably of gold. Also, a stress-relieving layer, preferably of gold, can be formed earlier between the adhesion layer of tungsten and the major surface of the wafer. Thereafter, the substrate is cut into the plurality of dies, each of which is bonded, for example, to a ceramic header ("submount"). Prior to the die's being bonded to the header, a major surface of the header is coated with a layer of gold that, in turn, is coated with a binding layer of solder, preferably a gold-tin eutectic. The purpose of the adhesion layer is to promote adhesion of the tungsten barrier layer to the substrate. The purpose of the barrier layer is to suppress migration of silicon from the substrate into the originally eutectic binding layer of solder, such migration causing an undesirable increase in the melting temperature of the binding layer of solder and hence a required undesirably high temperature rise in the wafer during the thermal-compression bonding process in which the binding layer of solder must be melted to wet the surface to be bonded. The purpose of the bonding layer of gold is to protect the barrier layer from oxidation that would weaken the resulting bond.

In the aforementioned patent, the thickness of the binding layer of solder was reported to be 0.5 to 1.0 mil, or 12.7 to 25.4 $\mu$m. Such a relatively large thickness, regardless of relatively small thicknesses of other layers, is not desirable in the context of relatively high power (over 100 milliwatt) lasers, because of the need of a significantly higher thermal conductance and hence significantly smaller thickness of the entire resulting bond between laser and submount.

On the other hand, when a gold-tin solder layer is made desirably thin from the standpoint of good and sufficient thermal conductance—i.e., about 4 $\mu$m or less—then surface regions of the solder suffer from premature freezing (solidification) during the bonding process when heat is applied in quantities sufficient to raise the temperature of the solder above its melting temperature, namely above 280° C. in cases where the gold-tin solder has a eutectic composition (gold: 80 per centum by weight; tin: 20 per centum by weight) and hence a desirable minimum melting temperature. This premature freezing is caused by migration of tin away from the surface of the solder (initially having a eutectic or even a tin-rich nearly eutectic composition), whereby (because the solder's surface regions no longer have the eutectic or nearly eutectic compositions) the melting (=freezing) point of the solder's surface regions dramatically increases, namely, by about 30° C. per centum (by weight) decrease in the tin component in the neighborhood of the eutectic composition on its tin-poor side. Consequently, surface regions of the solder undesirably solidify ("freeze") during bonding, because the bonding process cannot be performed at a temperature that is high enough to prevent this freezing and at the same time is low enough so as not to injure the device. This premature freezing of the solder causes poor "wetting" of the surface of the gold bonding layer (on the barrier layer) on the device by the solder and consequently poor bonding of the device to the submount. Thus, during subsequent device operation, the resulting poor thermal conductance of the resulting bond (caused by the poor "wetting") tends to cause injurious overheating of the device, and the resulting poor mechanical adhesion property of the bond tends to allow the device to detach from the submount.

On the other hand, gold-tin solder is preferred over other solders—such as indium, lead-tin, tin-lead, tin-indium, lead-indium-silver—because of its relatively high Young's modulus of elasticity and hence its resulting mechanically more stable (rigid) bond. Also bonds made from gold-tin solder tend to have desirably lower creep, such lower creep being associated with the relatively high melting temperature (280° C. or more) of a gold-tin solder. Moreover, gold-indium solder has too high a melting temperature (about 457° C.) for bonding lasers, because such a high temperature tends to injure the laser during bonding.

Therefore, it would be desirable to have a bonding method using a gold-tin solder, but which does not suffer from the short-comings of prior art.

SUMMARY OF THE INVENTION

The foregoing shortcomings of bonding together first and second bodies using gold-tin solder are alleviated by using a gold-tin solder composite layer formed in accordance with the steps of:

sequentially depositing a number (or "plurality") of alternating layers of gold and tin, the number of such layers being equal to at least three, and preferably at least seven, on a top surface of the first body or on a top surface of an auxiliary layer located on the surface of the first body, whereby the composite layer is formed with a top layer of gold, an intermediate layer of tin being located in direct physical contact with a bottom surface of the top layer of gold, the composition of the composite layer averaged over the number of layers being a tin-rich eutectic, and the top layer of gold and the next-to-top layer of tin having respective thicknesses in a ratio that is less than approximately 0.8, and preferably less than approximately 0.3, but preferably not less than approximately 0.2.

The overall average composition of the composite layer is advantageously gold in the approximately range of 75 to 78 per centum by weight, that is, a slightly gold-poor—i.e., slightly tin-rich—(nearly) eutectic mixture. The (total) number of alternating layers can be far in excess of three: samples having as many as (total) number of ten and a (total) number of eleven such alternating layers have been used successfully. Advantageously, the solder composite layer has an overall thickness (including all gold and tin layers) that is less than about 4 μm. Also, it has an overall average composition that is advantageously nearly eutectic and more specifically a (slightly) tin-rich eutectic—in order to minimize undesirable increases in the melting (=freezing) temperature of the gold-tin solder composite layer during bonding of the bodies under applied heat and pressure, the rate of melting temperature increase per fractional change in tin component (due to tin migration) being undesirably higher for a gold-rich (tin-poor) eutectic.

Regardless of the total number of alternating layers in the solder composite layer, its (total) thickness is advantageously less than 4 μm, and the top layer of this composite layer is a layer of gold. Thus, the (total) number of layers, gold plus tin, is an odd number if the bottom (first) layer is gold but is an even number if the bottom layer is tin. Furthermore, because the final (exposed surface) layer is a layer of gold that is relatively thin as compared with the immediately underlying tin layer, therefore, in response to the application of heat and pressure during bonding to the device, the region near the surface of the solder thus being gold-poor (tin-rich), the composition of the solder at its surface regions becomes nearly eutectic owing to the migration of tin away from the surface. At the same time, deterioration of the surface of the solder is prevented by the protective anti-oxidation feature of the final (thin) gold layer. In this way, during subsequent operation of the device, the bonding of the device to the submount remains firm, so that during device operation there is good heat flow from the device to the submount and at the same time there is good adhesion and hence stable mechanical alignment of the device with respect to the submount.

Advantageously further, the auxiliary layer is formed by a barrier layer located on an adhesion layer—typically nickel located on tin—the auxiliary layer being located between the gold-tin solder composite layer and the surface of the first body.

It is preferred that the bottom layer of the gold-tin solder composite layer be made of gold, and hence that the (total) number of layers in the composite layer be an odd number; whereby this bottom layer of gold furnishes a gold-rich interface, during bonding, with the underlying barrier layer (typically made of nickel). In this way, undesirable interactions between tin and the material of the barrier layer is retarded; and, at the same time migration of tin into the barrier layer is also retarded, whereby premature freezing of the gold-tin solder composite layer is desirably delayed.

The surface (to be bonded) of the second body likewise advantageously can have an adhesion layer, a barrier layer on the adhesion layer, and a similar solder composite layer on the barrier layer or just simply a gold layer on the barrier layer.

BRIEF DESCRIPTION OF THE DRAWING(S)

FIG. 1 is an elevational cross-sectional view of a bonding method in accordance with a specific embodiment of the invention.

Only for the sake of clarity the drawing is not to scale except that layers 23.1, 23.2, . . . 23.11 are drawn with relative thicknesses that conform to an approximate scale among one another.

DETAILED DESCRIPTION

Figure 1:
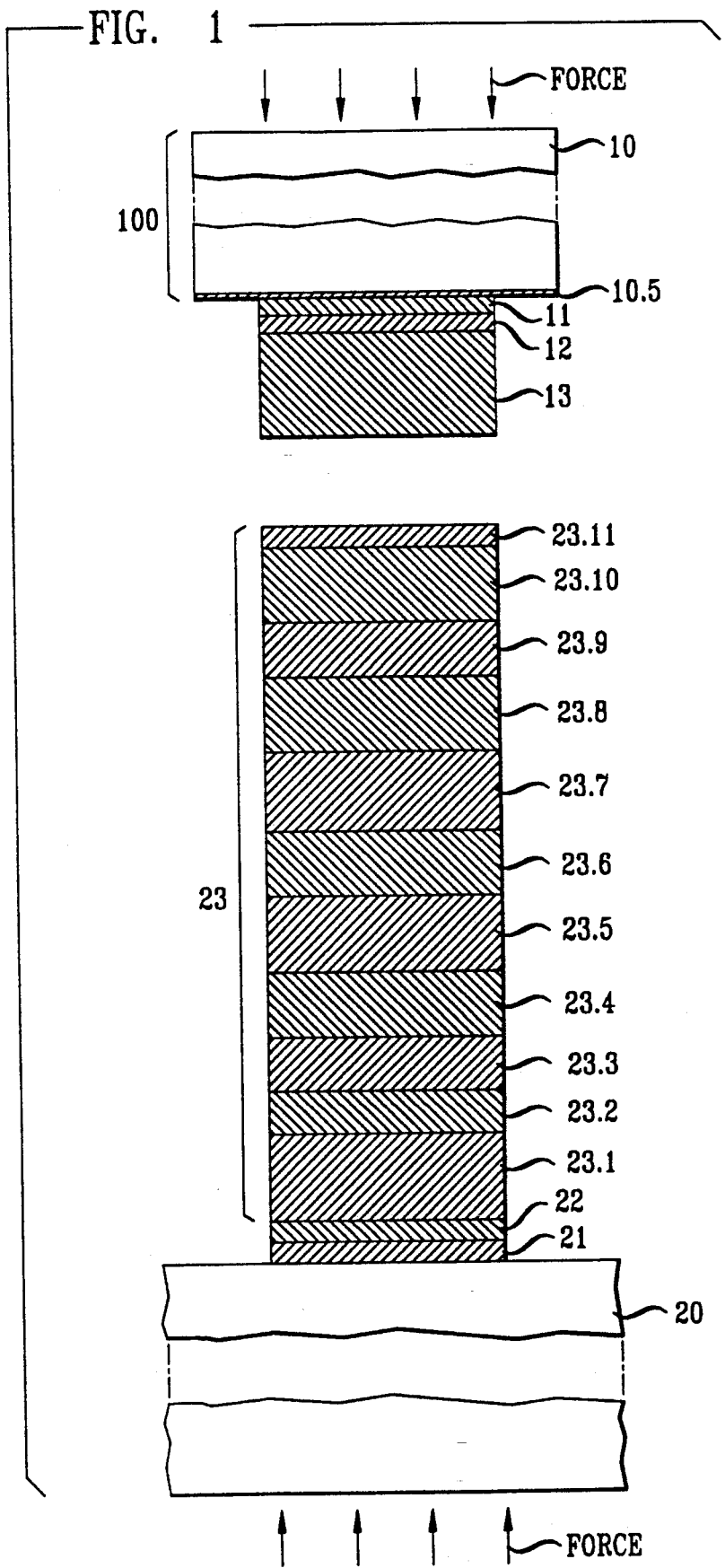

Referring to FIG. 1, a semiconductor laser structure 10, typically InP-based, has a bottom contact electrode layer 10.5, typically a gold-germanium alloy having a thickness of about 0.015 μm whereby a semiconductor laser device 100 is formed. On the electrode layer 10.5 is located an adhesion layer 11, typically a titanium layer having a thickness in the approximate range of 0.05 to 0.10 μm. On this adhesion layer 11 is located a barrier layer 12, typically a platinum layer having a thickness in the approximate range of 0.05 to 0.10 μm. On this barrier layer 12 is located a binder layer 13 of gold, having a thickness of typically about 0.5 μm.

A submount 20 is to be attached by metallic solder or epoxy to a stud of copper or to a ceramic board (not shown) after the bonding procedure has been performed. This submount 20 typically is made of silicon, ceramic, or low pressure chemically vapor deposited (LPCVD) diamond. Typically, the submount 20 has a thickness of about 250 μm. On at least a portion of the top surface of the submount 20 (namely, where the device 100 is to be bonded) is located an adhesion layer 21, typically titanium having a thickness of about 0.10 μm. On this adhesion layer 21 s located a barrier layer 22, typically nickel having a thickness of about 0.30 μm. Instead of nickel, other materials such as tungsten, chromium, ruthenium, or molybdenum can also be used for the barrier layer 22.

On the barrier layer 22 is located a solder composite layer 23 composed of multiple alternating layers 23.1, 23.2, . . . 23.11 and tin, starting with a bottom layer 23.1 of gold and ending with a top layer 23.11, both of gold. For example, the thicknesses of layers 23.1, 23.2, . . . 23.11 typically are respectively equal to approximately 0.400 μm of gold, 0.200 μm of tin, 0.250 μm of gold, 0.300 μm of tin, 0.325 μm of gold, 0.300 μm of tin, 0.375 μm of gold, 0.350 μm of tin, 0.250 μm of gold, 0.350 μm of tin, and 0.100 μm of gold—a total of eleven alternating layers. The total thickness of gold is thus equal to 1.70 μm; of tin 1.50 μm; for a total of 3.20 μm—that is, containing tin in an amount of 25 per centum by weight (a eutectic containing tin in an amount of about 20 per centum by weight)—whereby the composite layer 23 on the overall average has a tin-rich (gold-poor) near-eutectic composition. If the bottom layer of the solder composite layer 23 is tin instead of gold, the top layer always being gold, then there are an even number of layers in the composite layer instead of an odd number of layers. For example, the thicknesses of the alternating tin and gold layers, in accordance with another specific example, are (going from bottom to top) respectively equal to 0.200 μm of tin, 0.650 μm of gold, 0.300 μm of tin, 0.325 μm of gold, 0.300 μm of tin, 0.375 μm of gold, 0.350 μm of tin, 0.250 μm of gold, 0.350 μm of tin, and 0.100 μm of gold—a total of ten alternating layers. The total thickness of gold is again equal to 1.70 μm, and the total thickness of the tin is again equal to 1.50 μm, whereby the solder composite layer 23 is again a 3.20 μm thick tin-rich eutectic (averaged over its entire thickness). This thickness, when added to the thicknesses of the barrier and adhesion layers 22 and 21, amounts to a total thickness of only 3.60 μm.

The ratio of the thickness of the top layer 23.11 to the thickness of the (next-to-top) layer 23.10—i.e., the layer whose top surface is in immediate physical contact with the bottom surface of the top layer 23.11—is thus 0.100÷0.350=0.286, that is, less than 0.3. This ratio also holds in the other example, i.e., where the total number of alternating layers is ten. Accordingly, in both examples, the average composition is sufficiently gold-poor and hence tin-rich (with respect to their eutectic composition) that during their subsequent melting for thermal compression bonding (i.e., bonding with the gold layer 13 located on the laser device 100), and hence during migration of tin from the initial layer 23.10 into the initial top (gold) layer 23.11 even the surface of the solder composite layer 23 does not become an undesirable gold-rich eutectic mixture, i.e., a mixture that would suffer from premature freezing due to its relatively high melting (=freezing) temperature. On the other hand, the top layer 23.11 is advantageously gold in order to protect the underlying tin layer 23.10 from undesirable oxidation, prior to the melting during bonding that would otherwise occur if this tin layer 23.10 were not coated with gold.

The layers 11, 12, and 13 can all be formed by successive evaporation or sputtering using suitable metallic targets, as known in the art; and the layers 21, 22, as well as the layers 23.1, 23.2, . . . , 23.11, can likewise be formed by conventional evaporation or sputtering.

After formation of all these layers, bonding under applied heat and pressure is performed by applying compression forces F—typically amounting to a pressure in the approximate range of 1 to 3 Mega Pascal—to the exposed surfaces of the laser device 100 and of the submount 20, while heating the solder composite layer 23 to a temperature of approximately 320° C. for approximately 10 seconds. In this way, the solder composite layer 23 melts and wets the surface of the binder layer 13. After the applied heat and pressure are terminated, a bond is thus formed between the laser device 100 and the submount 20, with the composite layer 23.1, 23.2, . . . 23.11 having melted and fused into a tin-rich gold-tin eutectic.

Although the invention has been described in terms of specific embodiments, various modifications can be made without departing from the scope of the invention. For example, instead of the single layer 13 located on the laser device 10, a composite layer in accordance with the composite layer 23 can be used. Also, fewer than a total of ten layers can be used for the composite layer 23: a total of seven to fifteen layers is preferred, but as few as a total of three to six layers is useful. Finally, instead of less than about 0.3, the ratio of the thickness of the top layer 23.11 and the next-to-top layer 23.10 can be as high as about .0.8; and instead of 3.6 μm—i.e., less than 4 μm—the total thickness of the composite layer 23 can be as high as 5 μm. Preferably in all cases the bottom layer (as well as the top layer) in the composite layer is made of gold, and thus the number of multiple layers that form the composite layer is preferably an odd number.

We claim:

1. A method of bonding together first and second bodies comprising forming a first solder composite layer for the first body in accordance with the steps of sequentially depositing a plurality of alternating layers of gold and tin, the number of such layers being equal to at least three, on a top surface of the first body or on a top surface of an auxiliary layer located on the surface of the first body, whereby the first composite layer is formed with a top layer of gold, an intermediate layer of tin being located in direct physical contact with a bottom surface of the top layer of gold, the composition of the composite layer averaged over the number of layers being a tin-rich eutectic of gold and tin such that the first solder composite layer has an overall average content of gold in the approximate range of 75 to 78 percentum by weight, and the top layer of gold and the next-to-top layer of tin having respective thickness in a ratio that is less than approximately 0.8.

2. The method of claim 1 further comprising the step of physically applying an exposed surface layer of the second body to the top layer of the first body under heat and pressure that are sufficient to melt the first solder composite layer.

3. The method of claim 1 in which the ratio is less than approximately 0.3 and is greater than approximately 0.2.

4. The method of claim 1 or 3 in which the first solder-metallization composite layer has a total thickness of less than 4 μm.

5. The method of claim 4 further comprising the step of physically applying an exposed surface layer of the second body to the top layer of the first body under heat and pressure that are sufficient to melt the first solder composite layer.

6. The method of claim 5 in which the exposed surface layer of the second body comprises gold.

7. The method of claim 1 or 3 in which the auxiliary layer is provided and comprises a nickel layer.

8. The method of claim 1 or 3 in which the auxiliary layer is provided and includes a metallic layer formed by a member of the group consisting of tungsten, chromium, ruthenium, and molybdenum.

9. The method of claim 1 or 3 in which the first body comprises chemically vapor deposited diamond.

10. The method of claim 1 or 3 in which the plurality of alternating layers is equal to at least ten.

11. The method of claim 1 or 3 in which the plurality of alternating layers is equal to at least seven.

12. The method of claim 1 or 3 further comprising the step of physically applying an exposed surface layer of the second body to the top layer of the first body under heat and pressure that are sufficient to melt the solder-metallization composite layer.

13. The method of claim 12 in which the exposed surface layer of the second body comprises gold.

14. The method of claim 1 or 3 in which the number of alternating layers of tin and gold is an odd number.

* * * * *